(12) United States Patent
Moosburger et al.

(10) Patent No.: US 10,629,781 B2
(45) Date of Patent: Apr. 21, 2020

(54) SEMICONDUCTOR ELEMENT AND METHOD FOR PRODUCTION THEREOF

(71) Applicant: OSRAM OLED GmbH, Regensburg (DE)

(72) Inventors: Juergen Moosburger, Lappersdorf (DE); Lutz Hoeppel, Alteglofsheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/747,165

(22) PCT Filed: Jul. 20, 2016

(86) PCT No.: PCT/EP2016/067245
§ 371 (c)(1),
(2) Date: Jan. 24, 2018

(87) PCT Pub. No.: WO2017/016945
PCT Pub. Date: Feb. 2, 2017

(65) Prior Publication Data
US 2018/0219134 A1  Aug. 2, 2018

(30) Foreign Application Priority Data

Jul. 28, 2015 (DE) .................... 10 2015 214 228

(51) Int. Cl.
*H01L 33/48* (2010.01)
*H01L 23/31* (2006.01)
(Continued)

(52) U.S. Cl.
CPC ............ *H01L 33/486* (2013.01); *H01L 21/56* (2013.01); *H01L 23/3171* (2013.01);
(Continued)

(58) Field of Classification Search
CPC combination set(s) only.
See application file for complete search history.

(56) References Cited

U.S. PATENT DOCUMENTS 4,777,084 A * 10/1988 Marteness ............. C08G 59/56
442/149
6,331,450 B1 12/2001 Uemura
(Continued)

FOREIGN PATENT DOCUMENTS

| DE | 102008054235 A1 | 5/2010 |
|---|---|---|
| DE | 102013106609 A1 | 1/2015 |
| WO | 2011090269 A2 | 7/2011 |

OTHER PUBLICATIONS

German Search Report based on application No. 10 2015 214 228.0 (8 pages) dated Apr. 29, 2016 (for reference purpose only).
(Continued)

*Primary Examiner* — Ratisha Mehta
(74) *Attorney, Agent, or Firm* — Viering, Jentschura & Partner mbB

(57) ABSTRACT

A method for producing a component may include providing a composite including a semiconductor layer stack, a first connection layer and a second connection layer, wherein the first and second connection layers are arranged on the semiconductor layer stack, are assigned to different electrical polarities and are configured for the electrical contacting of the component to be produced, applying a molded body material on the composite for forming a molded body, such that in a plan view of the semiconductor layer stack the molded body covers the first connection layer and the second connection layer, forming a first cutout and a second cutout through the molded body for exposing the connection layers in places, and filling the first and second cutouts with an electrically conductive material for forming through contacts which are electrically conductively connected to the
(Continued)

connection layers and extend through the molded body in the vertical direction.

17 Claims, 4 Drawing Sheets

(51) Int. Cl.
*H01L 33/00* (2010.01)
*H01L 33/38* (2010.01)
*H01L 23/00* (2006.01)
*H01L 21/56* (2006.01)

(52) U.S. Cl.
CPC .............. *H01L 24/00* (2013.01); *H01L 24/05* (2013.01); *H01L 33/0079* (2013.01); *H01L 33/0095* (2013.01); *H01L 33/38* (2013.01); *H01L 33/382* (2013.01); *H01L 21/561* (2013.01); *H01L 24/03* (2013.01); *H01L 2224/05022* (2013.01); *H01L 2224/05026* (2013.01); *H01L 2224/05139* (2013.01); *H01L 2224/05144* (2013.01); *H01L 2224/05147* (2013.01); *H01L 2224/05568* (2013.01); *H01L 2224/94* (2013.01); *H01L 2933/0016* (2013.01)

(56) References Cited

U.S. PATENT DOCUMENTS

| | | | |
|---|---|---|---|
| 8,581,291 | B2 | 11/2013 | Shimokawa et al. |
| 2005/0161823 | A1 | 7/2005 | Jobetto et al. |
| 2007/0126016 | A1 | 6/2007 | Chen et al. |
| 2008/0105981 | A1 | 5/2008 | Kaneko |
| 2011/0090656 | A1 | 4/2011 | Hamatani et al. |
| 2011/0198635 | A1* | 8/2011 | Kim ...................... H01L 33/385 257/98 |
| 2012/0248482 | A1* | 10/2012 | Lin ........................ H01L 33/486 257/98 |
| 2015/0028450 | A1* | 1/2015 | Park ...................... H01L 23/481 257/532 |
| 2015/0140727 | A1* | 5/2015 | Jeong ................... H01G 9/2031 438/98 |
| 2016/0211221 | A1* | 7/2016 | Kim ....................... H01L 23/552 |
| 2017/0185108 | A1* | 6/2017 | Sasaki ...................... B32B 7/02 |

OTHER PUBLICATIONS

International Search Report based on application No. PCT/EP2016/067245 (6 pages + 3 pages English translation) dated Sep. 26, 2016 (for reference purpose only).

* cited by examiner

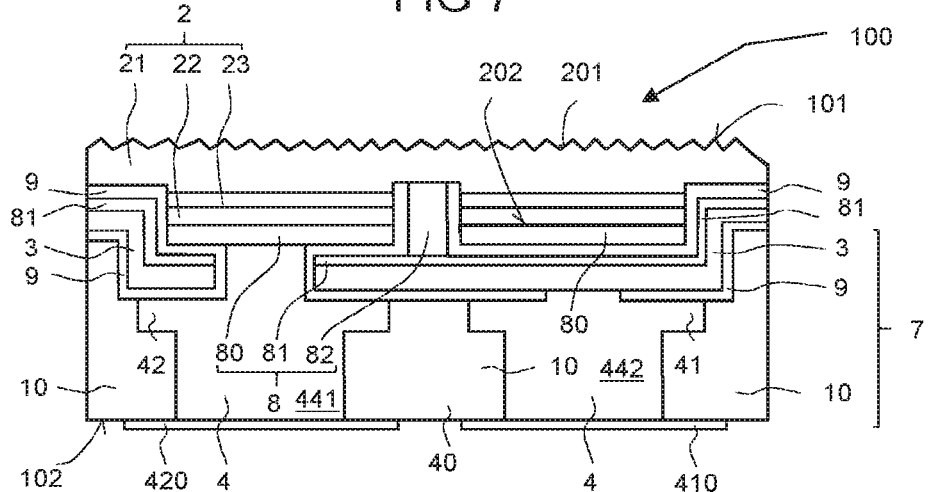
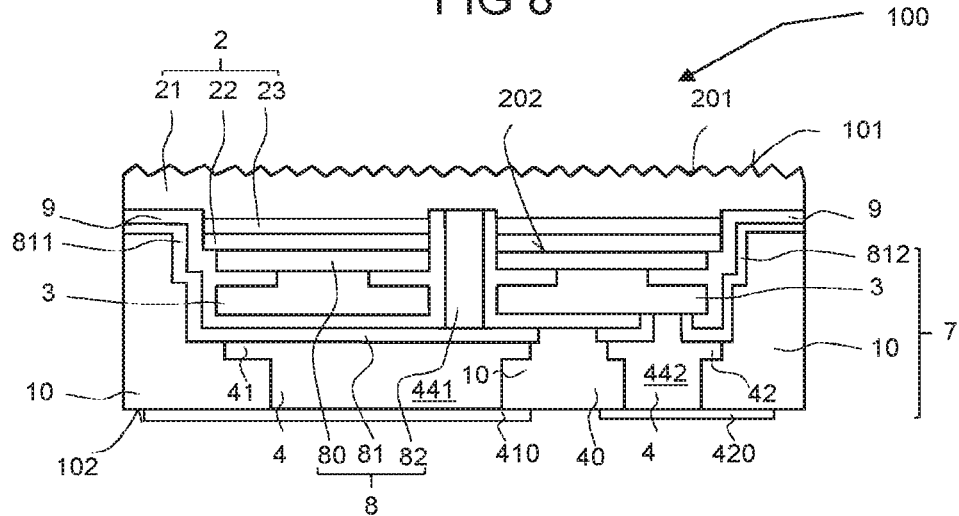

SEMICONDUCTOR ELEMENT AND METHOD FOR PRODUCTION THEREOF

RELATED APPLICATIONS

The present application is a national stage entry according to 35 U.S.C. § 371 of PCT application No.: PCT/EP2016/067245 filed on Jul. 20, 2016, which claims priority from German application No.: 10 2015 214 228.0 filed on Jul. 28, 2015, and is incorporated herein by reference in its entirety.

SUMMARY

In order to produce a housing for a semiconductor chip, the semiconductor chip can be encapsulated with a potting compound, thereby forming a component including the semiconductor chip and the cured potting compound as a housing. Alternatively, the housing can also be produced separately and the semiconductor chip can be positioned therein.

One object is to specify a simplified and cost-effective method for producing a mechanically stable component. Furthermore, a component having a high mechanical stability is specified.

In accordance with at least one embodiment of the method for producing a component, a composite composed of a semiconductor layer stack, a first connection layer and a second connection layer is provided. The composite is preferably a wafer composite. The wafer composite may include a growth substrate, on which the semiconductor layer stack is applied for instance by a coating method, preferably by an epitaxy method. The first connection layer and the second connection layer are configured in particular for the electrical contacting of the semiconductor layer stack and are associated for example with different electrical polarities of the component to be produced. The composite may also include a plurality of first connection layers and a plurality of second connection layers. The connection layers can be applied on the semiconductor layer stack by a coating method, for instance by an electrolytic or electroless coating method.

In accordance with at least one embodiment of the method, the composite is provided with a first metal layer. The first metal layer is arranged for instance between the connection layers and the semiconductor layer stack in a vertical direction. In particular, the first metal layer is electrically connected to one of the group including the first and second connection layers and is electrically insulated from the other connection layer from said group.

A vertical direction is understood to mean a direction which is directed in particular perpendicularly to a main extension surface of the semiconductor layer stack. A lateral direction is understood to mean a direction which runs in particular parallel to the main extension surface of the semiconductor layer stack. In particular, the vertical direction and the lateral direction are directed transversely, in particular perpendicularly, with respect to one another.

In accordance with at least one configuration, the first metal layer has a greater average vertical thickness than an average vertical thickness of the first connection layer or an average vertical thickness of the second connection layer. In plan view the first metal layer can laterally bridge an intermediate region arranged between the connection layers, preferably bridge a large portion of for instance at least 60%, at least 70% or at least 90% of the intermediate region and thereby mechanically reinforce the component to be produced at locations of the intermediate region. The first connection layer and the second connection layer are electrically isolated from one another by said intermediate region. The composite may include a plurality of such first metal layers, wherein each metal layer is assigned to a pair including a first connection layer and a second connection layer. The first metal layer or the first metal layers can thus serve as a mechanical reinforcement for the semiconductor layer stack and for the component to be produced.

In accordance with at least one embodiment of the method, the composite is provided with one or a plurality of isolation trenches. Such an isolation trench can extend into the semiconductor layer stack in the vertical direction. In particular, the semiconductor layer stack is subdivided into a plurality of semiconductor bodies of the components to be produced through the isolation trench or through the plurality of isolation trenches for example after a singulation step along the isolation trenches. That is to say that the composite including the semiconductor layer stack can be provided at the wafer level, wherein the semiconductor layer stack can be singulated into a plurality of semiconductor bodies.

The semiconductor layer stack may include a first semiconductor layer of a first charge carrier type and a second semiconductor layer of a second charge carrier type. Furthermore, the semiconductor layer stack includes an active layer, which is arranged in particular between the first and second semiconductor layers. For example, the active layer is a p-n junction zone. In this case, the active layer can be formed as one layer or as a layer sequence of a plurality of layers. The active layer is configured in particular to emit an electromagnetic radiation for instance in the visible, ultraviolet or infrared spectral range or to absorb an electromagnetic radiation and to convert said electromagnetic radiation into electrical signals or electrical energy. The semiconductor layer stack can be applied on a growth substrate layer by layer by an epitaxy method. The composite may therefore also include a growth substrate, on which the semiconductor layer stack is arranged. However, the growth substrate can be removed from the semiconductor layer stack in a subsequent method step, such that the component to be produced is in particular free of a growth substrate.

The semiconductor layer stack includes a first main surface, which is formed for example as a radiation passage surface. Furthermore, the semiconductor layer stack includes a second main surface, which faces away from the first main surface and is formed for example by a surface of a semiconductor layer, for instance of the second semiconductor layer. In particular, the first main surface and the second main surface delimit the semiconductor layer stack in the vertical direction. In particular, the first main surface adjoins the growth substrate. The first metal layer and also the connection layers are arranged on the semiconductor layer stack in particular on the side of the second main surface.

In accordance with at least one embodiment of the method, a molded body material is applied on the composite for forming a molded body of the component to be produced. The molded body material is formed in particular on the side of the second main surface of the semiconductor layer stack such that in a plan view of the semiconductor layer stack the molded body covers, in particularly completely covers, the first connection layer and the second connection layer.

In this case, the molded body material may include a matrix material reinforced with fibers, for instance fabric fibers or glass fibers. By way of example, the matrix material is a resin material such as an epoxy resin, for instance. Additionally or alternatively, the matrix material can be filled with white particles for instance with reflective and/or scattering particles composed of titanium oxide or silicon oxide. Preferably, the molded body material is only partly crosslinked and not completely crosslinked before being applied on the composite, as a result of which the molded body material can be processed in a simplified manner and the shape of the molded body can easily be modeled or altered. In particular, the molded body material is formed in the form of a two-phase film (bistage moldsheet) including a matrix material, fibers such as, for instance, glass fibers and/or fillers such as, for instance, white particles, wherein the matrix material with the fibers and/or fillers is not completely crosslinked and is only completely crosslinked after application or during application on the composite for instance by a thermal treatment.

The molded body material can be a printed circuit board material. A printed circuit board material is understood to mean a material which is used in the printed circuit board industry for the production of printed circuit boards, and includes for example a fiber-reinforced matrix material, wherein the fibers are embedded in the matrix material. By way of example, the molded body material includes a fiber-reinforced reaction resin. In particular, the molded body is formed from an FR4 prepreg layer or from a plurality of prepreg layers (laminate). The FR4 material is usually filled with glass fibers and therefore has a particularly high mechanical stability, for instance a significantly higher stability than a potting material filled with silicon-containing particles. The hot-pressed molded body and the component to be produced are thus formed in a particularly stable manner to withstand fracture.

In accordance with at least one embodiment of the method, the molded body material for forming the molded body is applied on the composite by hot pressing, as a result of which the molded body material is secured to the composite for instance after cooling in a natural manner. The molded body material, which is present only in a partly crosslinked fashion beforehand in particular with the fibers and/or with other fillers such as white particles, can be completely crosslinked by the hot pressing. In particular, the molded body material, before being applied on the composite, can be present in only a partly cured fashion, that is to say in only an incipiently dried and not completely cured fashion, wherein the molded body material is completely cured for instance after the hot pressing, as a result of which a solid and mechanically stable molded body is formed on the composite. In particular, a temperature above a glass transition temperature of the molded body material is used during the curing of the molded body material, such that after cooling the molded body acquires a permanent shape and is secured to the composite in a mechanically stable fashion.

In accordance with at least one embodiment of the method, at least one cutout is formed in the molded body for exposing at least one connection layer. By way of example, a first cutout is formed through the molded body for partly exposing the first connection layer and a second cutout is formed through the molded body for partly exposing the second connection layer. The first and second cutouts are spaced apart spatially from one another in the lateral direction for instance by the intermediate region, wherein the intermediate region is completely filled by the molded body material. The cutouts can be formed mechanically. Moreover, the cutouts can be produced by laser drilling, wherein the first and second connection layers can serve for instance as stop layers. Laser drilling is a particularly suitable method for producing such cutouts since, by this method, the cutouts can be produced in a highly targeted and precise manner with regard to their positions and sizes in a very short time. Moreover, it has been found that copper layers can serve as particularly suitable stop layers during laser drilling. The connection layers are therefore preferably formed from copper or consist thereof.

The connection layers can be formed in each case as a metal layer, wherein the metal layer has a vertical thickness which is in particular at most 15 µm. By way of example, the vertical thickness of the connection layers is at least 4 µm. Preferably, an average vertical thickness of the first and/or second connection layer is between 4 and 15 µm inclusive, between 4 and 10 µm inclusive, or between 4 and 8 µm inclusive, for example approximately 6 µm. With such a vertical thickness, the first connection layer and/or the second connection layer can be applied on the semiconductor layer stack in a simplified manner in particular by an electrolytic process or an electroless deposition process, since this small thickness of the connection layers allows a use of resists that are significantly easier to handle than a dry resist for instance. That is to say that the first and/or the second connection layer having such a small thickness can be applied on the semiconductor layer stack without great complexity for example by the structured application of metal layers by an electrolytic or electroless coating method, wherein the application and processing of a comparatively thick dry resist layer can be dispensed with. In this case, the comparatively thin connection layers can serve as a basis for subsequent process steps for instance for forming through contacts, extending through the molded body, for instance in the form of connection columns, wherein the through contacts have a vertical thickness which can be significantly greater than the thickness of the connection layers, for instance at least two times, five times or at least ten times or for instance at least twenty times the magnitude of the thickness of the connection layers.

In accordance with at least one embodiment of the method, the cutouts are filled with an electrically conductive material, for example with a metal such as copper, for example, for forming through contacts. The through contacts are electrically conductively connected to the connection layers and extend in a vertical direction through the molded body. The through contacts and connection layers form in particular a second metal layer of the component to be produced. The second metal layer can thus be subdivided in particular into at least two partial regions spaced apart laterally from one another, wherein a first partial region includes a first through contact and a first connection layer and a second partial region includes a second through contact and a second connection layer.

The second metal layer can indeed be formed in a single method step, for instance by an electrolytic or electroless coating method. However, this necessitates a dry resist layer having a thickness at least equal to a vertical thickness of the second metal layer. This comparatively thick dry resist layer has to be structured before the second metal layer is applied, and has to be removed after the second metal layer has been applied. On account of the comparatively large thickness of the second metal layer, which can be for instance 100 µm or a few hundred micrometers, processes regarding the structuring and subsequent removal of the dry resist layer are associated with great complexity. By forming the second metal layer in steps, namely by forming the relatively thin connection layers and filling the cutouts with an electrically conductive material, the formation of the second metal layer can be configured in a simplified, reliable and particularly efficient manner. Furthermore, the second metal layer is already surrounded by the molded body directly after the completion of said second metal layer, such that an encapsulation for instance by potting the metal layer with a potting material is no longer required. Moreover, a large selection of different materials is available for the electrically conductive material used for filling the cutouts. Moreover, different shapes of the cutouts and thus different shapes of the second metal layer can be produced in a simple manner.

In accordance with at least one embodiment of the method, before the molded body material is applied, the composite is provided in a manner free of a carrier that is different than a growth substrate. The method is designed in particular such that the component to be produced is mechanically carried by the second metal layer and by the molded body after the completion of said component. In particular, the second metal layer and the molded body form a carrier or a housing of the component to be produced. The component is additionally preferably mechanically reinforced by the first metal layer, wherein the first metal layer can also be formed as part of the carrier or of the housing.

In accordance with at least one embodiment of the method, the composite is provided with a plurality of first metal layers and a plurality of second metal layers with in each case a first connection layer and a second connection layer. The composite includes in particular one or a plurality of isolation trenches between the components to be produced, such that the composite can be singulated into a plurality of components along the isolation trenches after the formation of the molded body. The singulated components may each include a carrier and a semiconductor body arranged on the carrier, wherein the semiconductor body emerges from the semiconductor layer stack and the carrier is formed in particular from the singulated molded body, one of the first metal layers and one of the second metal layers with a first connection layer, a first through contact, a second connection layer and a second through contact. The singulated component may also include a plurality of first and/or second connection layers and a plurality of first and/or second through contacts. The carrier of the singulated component is thus formed directly on the semiconductor layer stack or on the semiconductor body, that is to say at the wafer level and not in a separate method step, such that the completed component in this sense is in particular free of a connecting layer for instance in the form of a soldering layer or an adhesive layer between the semiconductor body and the carrier.

In a method for producing one or a plurality of components, a composite including a first connection layer, a second connection layer and a semiconductor layer stack is provided, wherein the first and second connection layers are configured for the electrical contacting of the semiconductor layer stack and are assigned to different electrical polarities of the component to be produced. In a subsequent method step, a molded body material is applied on the composite, in particular on a surface of the composite facing away from the semiconductor layer stack, for forming a molded body, such that in a plan view of the semiconductor layer stack the molded body covers the first connection layer and the second connection layer. After the molded body material has been applied, a first cutout and a second cutout are formed through the molded body in order to expose the connection layers. The cutouts are subsequently filled with an electrically conductive material for forming through contacts which are electrically connected to the connection layers and extend through the molded body in the vertical direction.

By forming the connection layer and the associated through contact in stages, it is possible to dispense with a processing of a comparatively thick dry resist layer. By virtue of opening and filling the cutouts, there is also no need to grind back the molded body and/or the through contacts, as a result of which the risk of a deposition of metal residues, such as copper residues or copper atoms, on the radiation passage surface can be avoided. A risk regarding copper contamination, for instance, can thus be minimized. A further risk according to which a vertical interface between a through contact and the molded body is possibly not exposed during a grinding-back process, for instance, is likewise avoided by virtue of opening and filling the cutouts. Moreover, the method described here is particularly cost-effective on account of a large selection of molded body materials and is also applicable to a composite having a particularly large area, which may be for example an area of a composite of a plurality of original wafers and thus much larger than the typical wafer size. A uniform vertical structural height of the component can also be defined as early as after the formation of the molded body.

In one embodiment of a component, the latter includes a carrier and a semiconductor body arranged on the carrier. The carrier is formed at least from a molded body, a first through contact and a second through contact. The through contacts are spaced apart spatially from one another in a lateral direction and can in each case extend through the molded body in a vertical direction. The molded body here can laterally fully circumferentially enclose the through contacts. The component includes a first connection layer and a second connection layer spaced apart laterally from the first connection layer, wherein the connection layers are configured for the electrical contacting of the semiconductor body. The first and second connection layers are assigned to different electrical polarities of the component. The connection layers can be formed as parts of the carrier. In this case, the connection layers are for instance arranged between the semiconductor body and the through contacts and electrically connected to the through contacts. The molded body is formed integrally, in particular. That is to say that the molded body is continuous and can be produced for instance in a single method step. In particular, the molded body is formed from a pressed molded body material reinforced with fibers or fillers.

In accordance with at least one embodiment of the component, the molded body includes a first cutout and a second cutout. In this case, the first cutout and/or the second cutout can have an inner wall having separating traces. In particular, all inner walls of the first cutout and/or of the second cutout can have separating traces. In order to form the through contacts, the cutouts are filled for instance with an electrically conductive material. Separating traces are understood to mean traces on the inner wall of the cutout which arose for instance during the formation of the cutout. Such traces may be characteristic traces of a mechanical processing process, for instance of a drilling or milling process, or of a chemical processing process, for instance an etching process, or characteristic traces of a laser processing process. The separating traces may additionally be present for instance in the form of grooves filled with electrically conductive material or severed glass fiber bundles on the inner wall of the cutout.

In accordance with at least one embodiment of the component, the latter includes a first metal layer. The first metal layer is arranged for instance between the semiconductor body and the connection layers in a vertical direction. In particular, the first metal layer is electrically conductively connected to one of the connection layers and electrically insulated from another connection layer. In plan view an intermediate region arranged between the connection layers and between the through contacts is bridged or covered by the first metal layer along a lateral longitudinal direction, as a result of which the component is mechanically reinforced at locations of the intermediate region. In plan view the first metal layer thus overlaps both the first connection layer and the second connection layer. In particular, the first metal layer is free of an interruption in the region of the intermediate region.

The first metal layer can additionally have, in the intermediate region, a lateral width along a lateral transverse direction running transversely or perpendicularly with respect to the longitudinal direction, wherein the lateral width of the first metal layer differs at most by 30% or at most by 20% or preferably at most by 10% from a lateral width of the connection layers and/or of the through contacts along the lateral transverse direction. In this case, the lateral width of the first metal layer can be less than the lateral width of the connection layers and/or of the through contacts. The first metal layer can be formed as part of the carrier. The carrier may include a second metal layer, wherein the second metal layer includes the connection layers and the through contacts. Consequently, the component is externally electrically contactable via the second metal layer.

In accordance with at least one embodiment of the component, the latter includes a continuous insulation structure, which may include a single insulation layer or a plurality of insulation layers which in particular adjoin one another and thus form a continuous insulation structure. In other words, the continuous insulation structure can be produced by a plurality of separate method steps. In particular, the continuous insulation structure of the component is configured such that the insulation structure extends regionally into the semiconductor body and regionally adjoins the carrier or even extends into the carrier. The first metal layer can be electrically insulated from the first connection layer or from the second connection layer by the insulation structure. In particular, the insulation structure has an opening through which extends the first metal layer or the second metal layer, for instance a connection layer, for the electrical contacting of the semiconductor body. The insulation structure can have a plurality of such openings.

In accordance with at least one embodiment of the component, the latter includes a wiring structure for the electrical contacting of the semiconductor body with the first metal layer and/or with the second metal layer. By way of example, the wiring structure forms a wiring plane arranged substantially between the carrier and the semiconductor body. In particular, the wiring structure can extend regionally into the semiconductor body and/or into the carrier or at least regionally adjoin the semiconductor body and/or the carrier. By the wiring structure, the first connection layer and the second connection layer can be electrically conductively connected for instance to a first semiconductor layer of a first charge carrier type and respectively to a second semiconductor layer of a second charge carrier type of the semiconductor body.

The semiconductor body may additionally include an active layer, which is arranged between the first semiconductor layer and the second semiconductor layer in the vertical direction and is configured for emitting or for detecting electromagnetic radiations during operation of the component. Preferably, the wiring structure includes a plated-through hole which, for the electrical contacting of the first semiconductor layer, extends through the second semiconductor layer and the active layer into the first semiconductor layer. By virtue of the plated-through hole, the component can be embodied such that the latter is formed in a manner externally electrically contactable via a rear side of the component. In this case, external electrical contacting of the component may include in particular reflow soldering.

The method described here is particularly suitable for the production of a component described here. The features described in association with the component can therefore also be used for the method, and vice versa.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 7 and 8 show different embodiments of a component in schematic sectional views.

DETAILED DESCRIPTION

Elements that are identical, of identical type or act identically are provided with identical reference signs in the figures. The figures are in each case schematic illustrations and therefore not necessarily true to scale. Rather, comparatively small elements and in particular layer thicknesses may be illustrated with an exaggerated size for clarification.

Figure 1A:
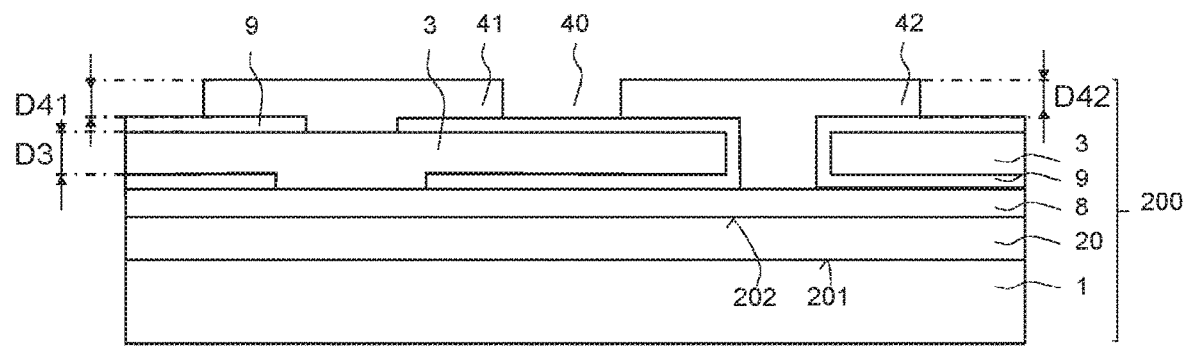
FIGS. 1A, 1B and 2 to 6 show various method stages of one embodiment of a method for producing one or a plurality of components in schematic sectional views.

FIG. 1A illustrates a composite 200. The composite includes a semiconductor layer stack 20. The semiconductor layer stack 20 is arranged on a substrate 1. The substrate 1 is in particular a growth substrate, for instance a sapphire substrate, wherein the semiconductor layer stack 20 is deposited onto the growth substrate layer by layer for instance by an epitaxy method. The semiconductor layer stack 20 includes a first main surface 201 facing the substrate 1 and a second main surface 202 facing away from the substrate 1. In particular, the first main surface 201 is formed by a surface of a first semiconductor layer 21 and the second main surface 202 is formed by a second semiconductor layer 22 of the semiconductor layer stack 20. The semiconductor layer stack 20 additionally includes an active layer 23 arranged between the first semiconductor layer 21 and the second semiconductor layer 22.

The composite 200 includes a wiring structure 8 on the side of the second main surface 202 of the semiconductor layer stack 20. The wiring structure 8 extends in a wiring plane and is configured for the electrical contacting of the semiconductor layer stack 20, wherein the wiring structure 8 can be electrically conductively connected directly to various semiconductor layers of the semiconductor layer stack 20. The composite 200 includes a first metal layer 3. The first metal layer 3 can be applied on the wiring structure 8 and/or on the semiconductor layer stack 20 preferably in a structured manner for instance by a coating method. In particular, the first metal layer contains a metal, for example Ni or Cu.

Furthermore, the composite 200 includes a first connection layer 41 and a second connection layer 42 spaced apart laterally from the first connection layer 41. In particular, the semiconductor layer stack 20 can be electrically contacted via the first connection layer 41 and the second connection layer 42. In this case, the connection layers 41 and 42 are assigned in particular to different electrical polarities of the component 100 to be produced and are electrically conductively connected to the respective semiconductor layers of the semiconductor layer stack 20 via the wiring structure 8. The connection layers 41 and 42 may include copper or consist of copper.

In FIG. 1A, the first metal layer 3 is arranged between the semiconductor layer stack 20 and the connection layers 41 and in the vertical direction. The composite 200 includes an insulation structure 9, wherein the first metal layer 3 is electrically insulated from one of the connection layers, from the second connection layer 42 in FIG. 1A, by the insulation structure 9. The insulation structure 9 has an opening through which the first connection layer 41 extends in order to form an electrical contact with the first metal layer 3. In FIG. 1A, the first metal layer 3 and the insulation structure 9 have a common opening through which the second connection layer 42 extends in order to form an electrical contact with the wiring structure 8. In this case, the first metal layer 3 can be formed in a continuous and integral fashion.

Furthermore, the insulation structure 9 has a further opening, through which the first metal layer 3 extends to the wiring structure 8. The wiring structure 8 and the insulation layer 9 are illustrated schematically in a simplified manner in FIG. 1A. In a departure from FIG. 1A, the wiring structure 8 and/or the insulation structure 9 can extend regionally into the semiconductor layer stack 20. The wiring structure 8 may include partial regions which for instance are electrically insulated from one another by the insulation structure 9 and are thus assigned to different electrical polarities of the component to be produced. The insulation structure 9 of a respective component 100 to be produced is formed in particular as a continuous insulation structure. In this case, the continuous insulation structure 9 may include electrically insulating partial layers which for instance are formed in separate method steps and directly adjoin one another and thus form a continuous structure. By way of example, the insulation structure 9 includes an electrically insulating material such as silicon oxide, for instance silicon dioxide, and/or silicon nitride or consists of at least one of these materials.

The first metal layer 3 and/or the connection layers 41, 42 can be deposited onto the semiconductor layer stack 20 in each case by an electrolytic or electroless coating method. In particular, the first metal layer 3 and/or the connection layers 41 and 42 are applied on the semiconductor layer stack 20 with the aid of a resist layer, which is structured, in particular. The first metal layer 3 has a vertical thickness D3 which is in particular between 3 and 30 µm inclusive, preferably between 6 and 15 µm inclusive, for instance approximately 10 µm.

The first connection layer 41 and the second connection layer 42 have a first vertical thickness D41 and a second vertical thickness D42, respectively, wherein the thicknesses of the connection layers are in each case in particular between 4 and 15 µm inclusive, preferably between 4 and 10 µm, or between 4 and 8 µm, for instance approximately 6 µm thick. In particular, the first metal layer 3 has an average thickness which is greater than an average thickness of the connection layer 41 and/or connection layer 42. By way of example, a ratio of the average thickness of the first metal layer 3 to the average thickness of the connection layers is between 1 to 2 inclusive or between 1 to 3 inclusive or between 1 to 5 inclusive. In particular, the first metal layer 3 is formed with a thickness such that the first metal layer 3 is formed as mechanically stable, in particular self-supporting, and thus contributes to the mechanical stabilization of the semiconductor layer stack 20 or of the component 100 to be produced.

The first metal layer 3 and the first and second connection layers 41, 42 are in each case formed in particular from a metal such as, for instance, copper or nickel, or from a metal alloy. In particular, the connection layers 41 and 42 and also the first metal layer 3 are configured such that the first metal layer 3 in plan view laterally bridges an intermediate region 40 arranged between the connection layers 41 and 42 and thus covers in particular a large portion, for instance at least 60%, for instance at least 70% or at least 90%, of the intermediate region 40. In particular, the first metal layer 3 can completely cover the intermediate region 40. As a result of the intermediate region 40 being bridged or covered by the first metal layer 3, the component 100 to be produced is mechanically reinforced by the first metal layer 3 at locations of the intermediate region 40, as a result of which the mechanical stability of the component is increased.

By way of example, the first metal layer 3 and the connection layers 41 and 42 are formed with regard to their materials such that the first metal layer has a higher modulus of elasticity than the connection layers 41 and 42 and/or the connection layers have a higher thermal conductivity than the first metal layer 3. By way of example, the first metal layer 3 includes nickel and the first and/or second connection layer 41, 42 includes copper. Such a configuration reduces the structural height of the component to be produced whilst maintaining sufficient mechanical stability of the component and a high efficiency regarding the heat dissipation through the first metal layer and through the connection layers.

Figure 1B:
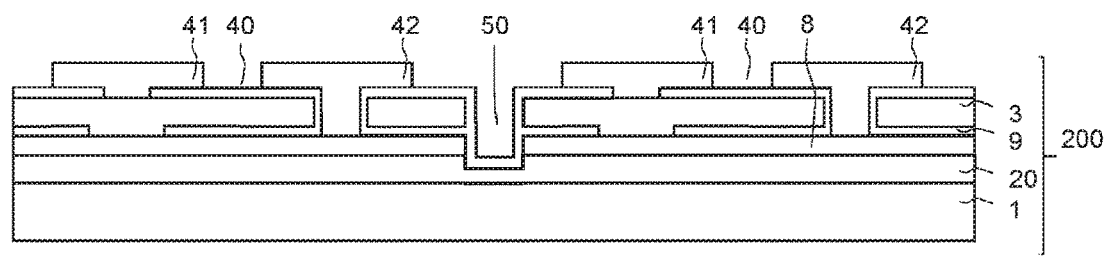

The embodiment illustrated in FIG. 1B substantially corresponds to the embodiment illustrated in FIG. 1A. In contrast thereto, the composite includes a plurality of first metal layers 3, a plurality of first connection layers 41 and also a plurality of second connection layers 42. The first metal layers 3 are spaced apart laterally for instance by an isolation trench 50. The isolation trench 50 can extend in the vertical direction from the side of the connection layers into the semiconductor layer stack 20. In a departure from FIG. 1B, the composite 200 may include a plurality of isolation trenches 50. Along the isolation trenches 50, the composite 200 can be singulated into a plurality of components, such that the singulated components include a semiconductor body, one of the first metal layers 3, one of the first connection layers 41 and one of the second connection layers 42, wherein the semiconductor body 2 emerges from the semiconductor layer stack 20. The insulation structure can be formed such that it extends regionally into the isolation trench 50. In particular, the insulation structure 9 can cover a bottom surface of the isolation trench 50, wherein the composite 200 is severed during singulation through the insulation structure 9 in the isolation trench 50. In a departure from FIG. 1B, the first metal layer 3 can likewise extend at least partly into the isolation trench 50.

Figure 2:
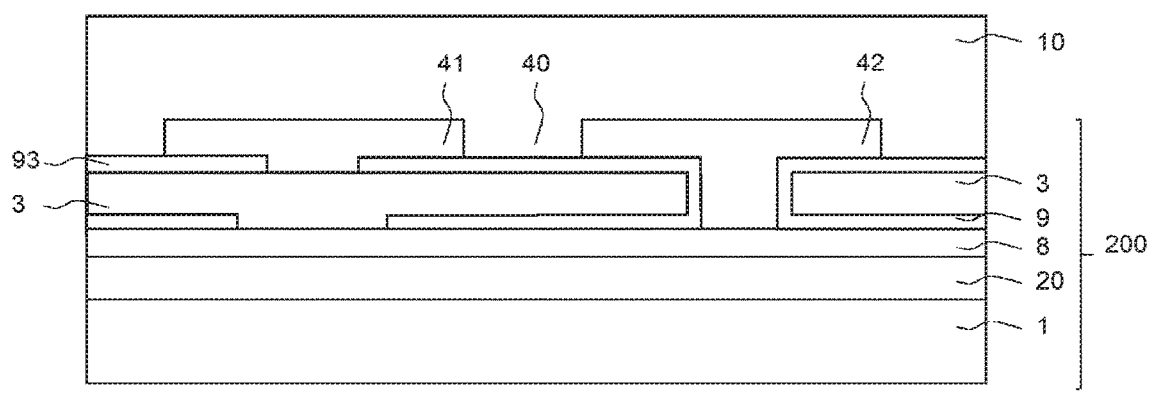

In FIG. 2, a molded body material, for instance an electrically insulating plastic, is applied on the composite 200 for forming a molded body 10. In a plan view of the semiconductor layer stack 20 the molded body 10 covers the first connection layer 41, the second connection layer 42 and also the intermediate region 40, formed between the connection layers, in particular completely. The molded body material can be a potting compound that is applied on the composite 200 by a molding method preferably under the action of pressure, for instance by injection molding, transfer molding or compression molding.

Alternatively, the molded body material can be a matrix material which in particular includes a resin material and is filled for example with fibers, for instance with glass fibers or fabric fibers, and/or with white particles, in particular scattering or reflective particles composed, for instance, of a silicon or titanium oxide. In particular, the molded body material is a printed circuit board material. Instead of potting or molding, it proves to be particular expedient and efficient to apply such molded body material on the composite by pressing, in particular by hot pressing, and thereby to secure it to the composite. The molded body material can be only partly crosslinked and not completely crosslinked before being applied on the composite. A complete crosslinking of the matrix material of the molded body material can be effected by a thermal treatment during the application or after the application of the molded body material on the composite. Moreover, the molded body material, before being applied on the composite, can be present in a partly cured fashion, that is to say for instance in an incipiently dried fashion, and can be completely cured only after being applied on the composite.

By way of example, the molded body material is a glass-fiber-reinforced epoxy resin. Moreover, the molded body 10 can be formed from an FR4 prepreg layer or from a plurality of such prepreg layers (laminate). The molded body 10 may include fillers that scatter and/or reflect radiation. In this case, the molded body material can be filled, in particular highly filled, with white particles, for instance with scattering or reflective particles such as titanium oxide or silicon oxide particles. A material which is highly filled with white particles is understood to mean a material which includes a matrix material and white particles embedded into the matrix material, wherein the white particles make up for instance at least 30 or 40 or 60, for instance at least 70 or at least 80, % by weight or volume of the highly filled material. In the case of a glass-fiber-reinforced epoxy resin including highly filled white particles, the proportion of white particles can also be less than 60%.

Figure 3:
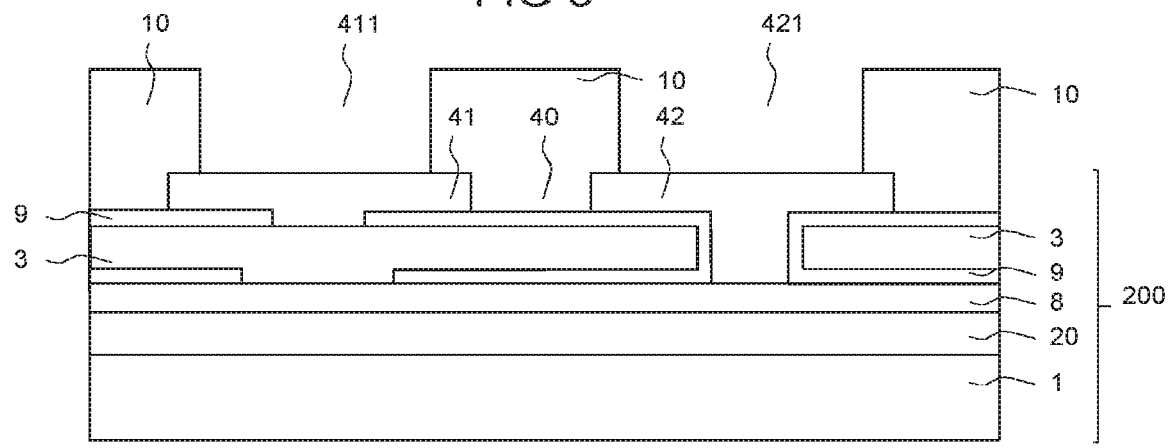

In FIG. 3, cutouts into the molded body 10 are formed. The cutouts extend through the molded body 10 in a vertical direction in order to partly expose the connection layers 41 and 42. The first connection layer 41 is partly exposed through a first cutout 411. That is to say that a surface of the first connection layer is at least partly exposed in the first cutout 411. The second connection layer 42 is partly exposed through a second cutout 421. The cutouts 411 and 421 are spaced apart spatially in a lateral direction by a partial region of the molded body 10, wherein the partial region of the molded body for example completely covers the intermediate region 40. The cutouts 411 and 421 can be enclosed by the molded body 10 fully circumferentially in the lateral directions.

The cutouts 411 and 421 can be formed by a mechanical process or by laser drilling, wherein the connection layers 41 and 42 in each case serve as stop layers. In particular, the cutouts 411 and 421 are formed after a complete curing and/or after the complete crosslinking of the matrix material or of the molded body material of the molded body 10.

Figure 4:
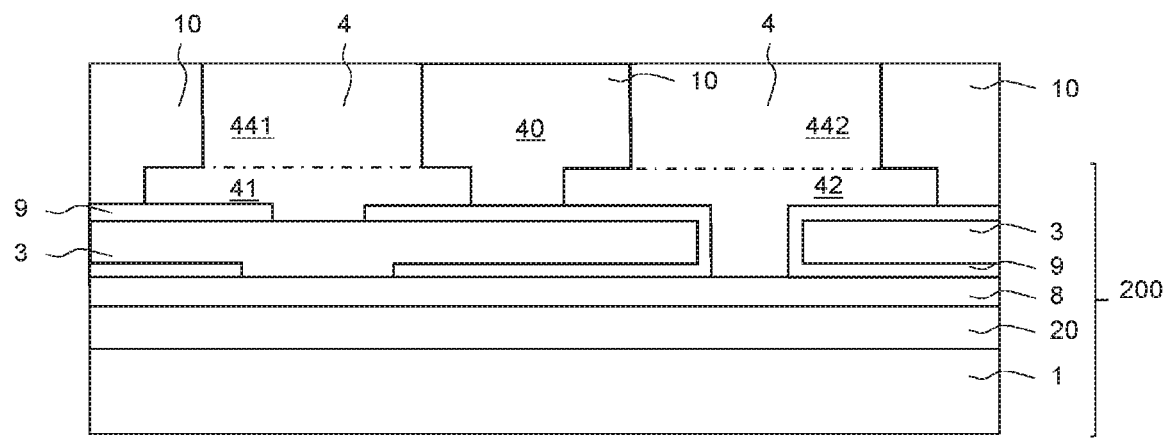

In a subsequent method step, as illustrated in FIG. 4, the cutouts 411 and 421 are filled with an electrically conductive material, as a result of which a respective through contact 441 or 442 for instance in the form of a connection column is formed in the cutouts, said through contact being electrically conductively connected to the respective connection layer 41 or 42 and being in particular in direct physical and thus also in direct electrical contact with the corresponding connection layer.

For forming the through contacts 441 and 442, use is made of copper, in particular, on account of its excellent electrical and thermal conductivity. In comparison with further high-performance materials such as silver and gold, copper is particularly cost-effective. Copper is additionally a particularly suitable material for filling cutouts by an electrolytic method since, on account of its anisotropic material behavior, copper can be applied electrolytically on bottom surfaces of the cutouts in a highly targeted manner, wherein the bottom surfaces preferably include copper. The connection layers 41 and 42 can each likewise be formed from copper or be coated at least with copper, thereby forming optimum mechanical, electrical and thermal connections between the connection layers and the through contacts. Moreover, copper is relatively soft in comparison with other metals such as nickel or iron, for instance, such that the connection layers or through contacts formed from copper can successfully absorb external mechanical influences. Moreover, copper and many commercially available molded body materials have a comparable coefficient of thermal expansion, such that a carrier formed for instance from copper and a commercially available molded body material is particularly stable vis-à-vis temperature changes. However, it is also possible for the through contacts and the connection layers to include different electrically conductive materials, for instance different metals.

The cutouts 411 and/or 421 and the through contacts 441 and/or 442 can have different shapes, for instance parallelepipedal, cylinder-like, truncated-cone-like, truncated-pyramid-like, or can have other shapes. In particular, the through contacts are formed as connection columns 441 and 442. A column is generally understood to mean a geometric structure having a vertical height, a lateral width and a lateral cross section, wherein the lateral cross section has a substantially unchanged shape along the vertical direction, that is to say along the height, and wherein an absolute value regarding an area of the cross section along the vertical direction in particular does not change abruptly. The through contact in this sense is formed integrally, in particular, and is producible for instance in a single method step. For example, the lateral cross section of the column or of the through contact has the shape of a circle, a polygon, an ellipse or other shapes. An aspect ratio regarding the height to width can be between 0.1 and 10 inclusive, for instance between 0.3 and 3 inclusive, or more. A geometric structure having abruptly changing areas of the cross section along the vertical direction, for instance with a step on side surfaces of the geometric structure, is often attributable to a composite composed of two or more partial layers produced in separate method steps, and in case of doubt should not be understood as the through contact described here in the form of a column.

The through contacts 441 and 442 can each have an average vertical height and an average lateral width, wherein a ratio between the width and the height is for example between 0.2 to 5 inclusive, for instance between 2 to 5 or between 1 to 3. In particular, the average width of the through contact is greater than an average height of the through contact, as a result of which the component to be produced is formed with particularly good thermal conductivity. The through contacts 441 and 442 are formed in particular such that they terminate flush with the molded body 10 in the case of a vertical height.

In FIG. 4, the connection layers and the through contacts form a second metal layer 4, wherein the second metal layer 4 includes a first partial region and a second partial region spaced apart laterally from the first partial region. The first partial region of the second metal layer 4 contains a first connection layer 41 and a first through contact 441. The second partial region of the second metal layer 4 contains a second connection layer 42 and a second through contact 442. In particular, the second metal layer 4 is enclosed by the molded body 10 fully circumferentially in a lateral direction. In this case, the molded body 10 can be formed continuously, in particular integrally. The isolation trenches 50 can also be filled with the molded body material. In FIG. 4, the first through contact 441 with the first connection layer 41 forms a first step in the molded body 10. The second through contact 442 with the second connection layer 42 forms a second step in the molded body 10. In particular, the first and/or second step extend(s) circumferentially around the associated through contact and are/is laterally completely covered by the molded body 10.

Figure 5:
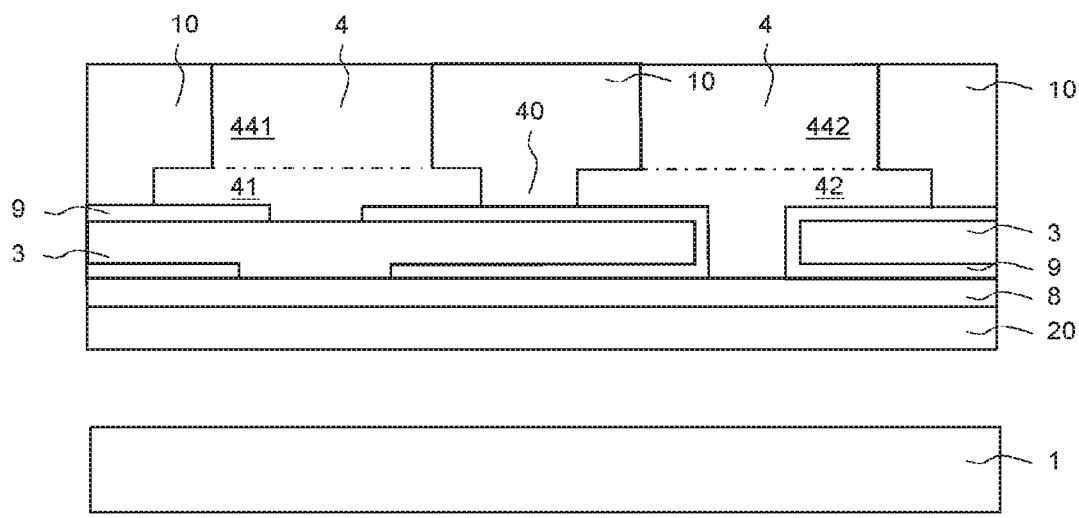

In FIG. 5, the substrate, in particular the growth substrate, is separated from the semiconductor layer stack 20 for example by a mechanical or chemical separating method or by a laser lift-off method. A surface of the composite 200 that is exposed as a result of the removal of the substrate 1, said surface being formed in particular by a surface of the semiconductor layer stack 20, can be structured in order to increase the light coupling-in efficiency and/or light coupling-out efficiency.

Before the composite 200 is singulated, contact layers 410 and 420 can be applied on the through contacts 441 and 442. By way of example, a first contact layer 410 and a second contact layer 420 cover the first through contact 441 and the second through contact 442, respectively, completely in plan view, as a result of which the through contacts 441 and 442 and connection layers 41 and 42, that is to say in particular the entire second metal layer 4, are completely enclosed by the molded body 10, the contact layers 410 and 420 and the wiring structure 8, as a result of which the second metal layer 4 is protected against environmental influences and against the risk of possible oxidation. The complete encapsulation of the second metal layer 4 makes it possible to prevent a situation in which metal residues of the second metal layer 4, which includes copper, for example, for instance during the singulation of the composite 200, can reach a front side of the component 100 to be produced and thereby possibly damage the semiconductor layer stack 20. The complete encapsulation of the second metal layer 4 additionally prevents migration for instance of copper atoms or copper ions for example via outer surfaces of the component to the front side of the component in particular during operation of the component. It is also possible for the wiring structure 8 to include a diffusion barrier layer 80 that prevents migration for instance of copper atoms or copper ions into the semiconductor layer stack 20.

Figure 6:
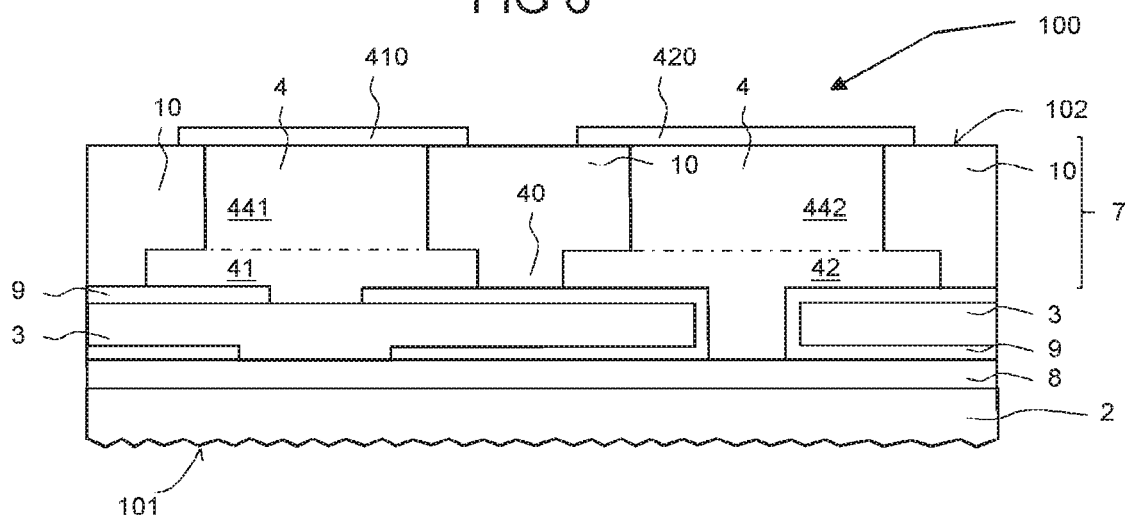

The composite 200 can be singulated into a plurality of components 100 along the isolation trenches 50 such that the singulated components 100, as illustrated for example in FIG. 6, each include a carrier 7 and a semiconductor body 2 arranged on the carrier 7. The semiconductor body 2 emerges from the semiconductor layer stack 20 during the singulation of the composite 200. The carrier 7 is formed in particular from the singulated molded body 10, a first metal layer 3 and a second metal layer 4 with a first connection layer 41 and a second connection layer 42. In this case, the component 100 includes a structured radiation passage surface 101, which can be formed by the first main surface 201 of the semiconductor body 2. The component 100 is externally electrically contactable in particular on a rear side 202, facing away from the radiation passage surface 101, for instance by the first contact layer 410 and the second contact layer 420. That is to say that the component 100 is formed as a surface-mountable component.

FIG. 7 schematically illustrates one embodiment of a component 100. This embodiment substantially corresponds to the embodiment of a component as illustrated in FIG. 6. In contrast thereto, the wiring structure 8 and the insulation structure 9 are illustrated in greater detail.

In FIG. 7, the wiring structure 8 includes a current spreading layer 80, an electrically conductive layer 81 and a plated-through hole 82. In this case, the wiring structure 8 extends regionally into the semiconductor body 2 and regionally into the carrier 7 or at least regionally adjoins the carrier 7. The first partial region of the second metal layer 4 having the first through contact 441 and the first connection layer 41 is electrically conductively connected to the first semiconductor layer 21 of the semiconductor body 2 via the first metal layer 3, the electrically conductive layer 81 and the plated-through hole 82. The second partial region of the second metal layer 4 having the second through contact 442 and the second connection layer 42 is electrically conductively connected to the second semiconductor layer 22 of the semiconductor body 2 via the current spreading layer 80. The plated-through hole 82 is electrically conductively connected to the first metal layer 3 and formed such that it extends at least from the second main surface 202 through the second semiconductor layer 22 and the active layer 23 for the purpose of electrically contacting the first semiconductor layer 21.

The current spreading layer 80 is in particular simultaneously formed as a diffusion barrier layer and completely covers for instance an opening of the insulation layer 9, through which opening the first metal layer 3 or a connection layer 42 extends. The current spreading layer 80 and the insulation structure 9 have a common opening through which the plated-through hole 82 extends for instance from the electrically conductive layer 81 to the semiconductor body 2.

The electrically conductive layer 81 is formed in particular as a mirror layer and in this case may include a metal, for instance aluminum, rhodium, palladium, silver or gold. In this case, the electrically conductive layer covers the active layer at least regionally in plan view. Along the vertical direction the electrically conductive layer 81 can extend laterally with respect to the semiconductor body to an extent such that it laterally surrounds the second semiconductor layer 22 or the active layer 23. Electromagnetic radiations emerging laterally or rearwardly from the semiconductor body 2 can thus be reflected back again in the direction of the active layer 23 or in the direction of the radiation passage surface 101 of the component, as a result of which the efficiency of the component is increased. In FIG. 7, the electrically conductive layer 81 is formed in a continuous fashion.

In FIG. 7, the insulation structure 9 is illustrated as a continuous insulation structure which extends regionally into the semiconductor body 2 and regionally into the carrier 7 or at least regionally adjoins the carrier 7. The plated-through hole 82 is electrically isolated from the second semiconductor layer 22 and from the active layer 23 in the region of the semiconductor body 2 in the lateral direction by the insulation structure 9. By the insulation structure 9, the first metal layer 3 is electrically isolated from the second partial region of the second metal layer 4 having the second through contact 442 and the second connection layer 42.

FIG. 8 schematically illustrates a further embodiment of a component. This embodiment substantially corresponds to the embodiment of a component as illustrated in FIG. 7.

In contrast thereto, the plated-through hole 82 extends through the first metal layer 3. In this case, the first metal layer 3 and the insulation structure 9 have a common opening. In contrast to FIG. 7, in which the first metal layer 3 is arranged between the electrically conductive layer 81 and the metal layer 4 in the vertical direction, in FIG. 8 the electrically conductive layer 81 is arranged between the first metal layer 3 and the second metal layer 4.

Furthermore, the electrically conductive layer 81 is subdivided into a first partial layer 811 and a second partial layer 812, wherein the partial layers 811 and 812 are laterally spaced apart from one another and thus electrically insulated from one another in the region of the intermediate region 40. The partial layers 811 and 812 are electrically conductively connected to the first connection layer 41 and the second connection layer 42, respectively, and thus associated with different electrical polarities of the component 100.

Both in FIG. 7 and in FIG. 8, the first metal layer 3 is formed continuously, in particular integrally. In FIG. 7, the first metal layer 3 has an opening through which the second connection layer 42 extends. In FIG. 8, the first metal layer 3 has an opening through which extends the plated-through hole 82 of the wiring structure 8 for the electrical contacting of the first semiconductor layer 21. In FIG. 7, the first metal layer 3 is configured for the electrical contacting of the first semiconductor layer 21. In FIG. 8, the first metal layer 3 is configured for the electrical contacting of the second semiconductor layer 22. The first metal layer 3 in FIG. 8 is additionally completely enclosed by the insulation structure 9 in the lateral direction. In accordance with FIGS. 7 and 8, the semiconductor body 2 can be enclosed by the insulation structure 9 fully circumferentially in lateral directions at least at the level of the second semiconductor layer 22. The carrier 7 with the molded body 10 can also enclose the semiconductor body 2 fully circumferentially in a lateral direction at the level of the second semiconductor layer 22, such that the carrier 7 is simultaneously formed as a housing for the semiconductor body 2.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing a component comprising:
   a) providing a composite comprising a semiconductor layer stack, a first connection layer and a second connection layer, wherein the first and second connection layers are arranged on the semiconductor layer stack, are assigned to different electrical polarities and are configured for the electrical contacting of the component to be produced,
   b) applying a molded body material on the composite for forming a molded body, such that in a plan view of the semiconductor layer stack the molded body covers the first connection layer and the second connection layer,
   c) forming a first cutout and a second cutout through the molded body for exposing the connection layers in places, and
   d) filling the first and second cutouts with an electrically conductive material for forming through contacts which are electrically conductively connected to the connection layers and extend through the molded body in the vertical direction,
   wherein the composite is provided with a first metal layer, wherein the first metal layer is arranged between the connection layers and the semiconductor layer stack in a vertical direction, is electrically conductively connected to one of the connection layers and is electrically insulated from the other connection layer, and the first metal layer has an average vertical thickness which is greater than an average vertical thickness of the first connection layer and/or of the second connection layer, and wherein an intermediate region is formed between the connection layers and/or between the through contacts said intermediate region being bridged laterally by the first metal layer in plan view.

2. The method as claimed in claim 1, wherein the molded body material for forming the molded body is applied on the composite by hot pressing and is thereby secured to the composite.

3. The method as claimed in claim 1, wherein the molded body material is a matrix material filled with fibers and/or with white particles, wherein the molded body material is only partly crosslinked and not completely crosslinked before being applied on the composite.

4. The method as claimed in claim 1, wherein the molded body is formed from an FR4 prepreg layer or from a plurality of prepreg layers.

5. The method as claimed in claim 1, wherein the molded body material is a glass-fiber-reinforced epoxy resin which is present in a partly cured fashion before being applied on the composite and is completely cured after being applied.

6. The method as claimed in claim 1, wherein the first connection layer is applied on the semiconductor layer stack by a coating method, wherein the first connection layer has a vertical thickness of at most 10 μm.

7. The method as claimed in claim 1, wherein the cutouts are formed by laser drilling, wherein the connection layers serve as stop layers during the laser drilling.

8. The method as claimed in claim 1, wherein the first connection layer and/or the second connection layer contain(s) copper and/or the cutouts are filled with copper.

9. The method as claimed in claim 1, wherein the composite is a wafer composite.

10. The method as claimed in claim 1 for producing a plurality of components, wherein the composite comprises a plurality of first connection layers spaced apart laterally and a plurality of second connection layers spaced apart laterally, the molded body material is applied on the composite for forming the molded body in such a way that the molded body covers the plurality of first connection layers and the plurality of second connection layers, a plurality of first and second through contacts are formed by forming and filling a plurality of first and second cutouts, the composite comprises one or more isolation trenches, and after the formation of the molded body the composite is singulated into a plurality of components along the isolation trench or isolation trenches in such a way that the components each comprise a carrier and a semiconductor body arranged on the carrier, wherein the semiconductor body contains part of the semiconductor layer stack, and the carrier contains part of the molded body, one of the first connection layers, one of the second connection layers, one of the first through contacts and one of the second through contacts.

11. A component comprising a carrier and a semiconductor body arranged on the carrier, wherein the carrier comprises at least one molded body, a first through contact and a second through contact, wherein the through contacts are spaced apart spatially from one another in a lateral direction and in each case extend through the molded body in a vertical direction, and the molded body laterally fully circumferentially encloses the through contacts, the component comprises a first connection layer and a second connection layer spaced apart laterally from the first connection layer, wherein the connection layers are configured for the electrical contacting of the semiconductor body, are associated with different electrical polarities of the component, are arranged between the semiconductor body and the through contacts and are electrically conductively connected to the through contacts, and the molded body is formed integrally and from a molded body material that is pressed and/or reinforced with fibers or fillers.

12. The component as claimed in claim 11, wherein the molded body has a first cutout and a second cutout, wherein the cutouts each have an inner wall having separating traces and are filled with an electrically conductive material defining the through contacts.

13. The component as claimed in claim 11, which comprises a first metal layer, which is arranged between the semiconductor body and the connection layers in a vertical direction and in this case is electrically conductively connected to one of the connection layers and is electrically insulated from the other connection layer, wherein the first metal layer in plan view bridges an intermediate region, which is arranged between the connection layers and/or between the through contacts, along a lateral longitudinal direction.

14. The component as claimed in claim 12, wherein the first metal layer is free of an interruption in the intermediate region and has a lateral width along a lateral transverse direction running transversely or perpendicularly with respect to the longitudinal direction, wherein the lateral width of the first metal layer differs at most by 30% from a lateral width of the connection layers along the lateral transverse direction.

15. The component as claimed in claim 13, which comprises a continuous insulation structure which extends regionally into the semiconductor body and at least regionally adjoins the carrier, wherein the first metal layer is electrically insulated from one of the connection layers by the insulation structure, and the insulation structure has at least one opening through which extends the first metal layer or one of the connection layers for the electrical contacting of the semiconductor body.

16. The component as claimed in claim 11, which comprises a wiring structure, wherein the wiring structure extends regionally into the semiconductor body and at least regionally adjoins the carrier, and the first connection layer and the second connection layer are electrically connected to a first semiconductor layer of a first charge carrier type and respectively to a second semiconductor layer of a second charge carrier type of the semiconductor body by the wiring structure.

17. The component as claimed in claim 16, wherein the semiconductor body comprises an active layer arranged between the first semiconductor layer and the second semiconductor layer and configured for emitting or detecting electromagnetic radiations during operation of the component, wherein the wiring structure comprises a plated-through hole which, for the electrical contacting of the first semiconductor layer, extends through the second semiconductor layer and the active layer into the first semiconductor layer.

* * * * *